United States Patent
Chen

(10) Patent No.: US 11,271,525 B2
(45) Date of Patent: Mar. 8, 2022

(54) INDUCTOR-CAPACITOR OSCILLATOR AND COMMON MODE RESONATOR

(71) Applicant: REALTEK SEMICONDUCTOR CORPORATION, Hsinchu (TW)

(72) Inventor: Yung-Chung Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/984,474

(22) Filed: Aug. 4, 2020

(65) Prior Publication Data
US 2021/0152123 A1    May 20, 2021

(30) Foreign Application Priority Data

Nov. 15, 2019 (TW) ................................. 108141541

(51) Int. Cl.
*H03B 5/12* (2006.01)

(52) U.S. Cl.
CPC .......... *H03B 5/1228* (2013.01); *H03B 5/1212* (2013.01)

(58) Field of Classification Search
CPC .................................................... H03B 5/1228
USPC ..................................................... 331/117 FE
See application file for complete search history.

(56) References Cited

U.S. PATENT DOCUMENTS

| | | | |
|---|---|---|---|
| 6,320,491 B1 | 11/2001 | Gevorgian et al. | |
| 8,305,182 B1 | 11/2012 | Tsai et al. | |
| 8,884,713 B2 * | 11/2014 | Tham ................... | H03B 5/1228 331/167 |
| 9,490,745 B1 * | 11/2016 | Toso ..................... | H03B 5/1215 |
| 10,483,937 B2 | 11/2019 | Chen et al. | |
| 10,855,224 B2 * | 12/2020 | Kalia ..................... | H03B 5/124 |
| 2004/0066241 A1 * | 4/2004 | Gierkink .............. | H03B 5/1296 331/46 |

(Continued)

FOREIGN PATENT DOCUMENTS

TW    I660594 B    5/2019

OTHER PUBLICATIONS

IEEE paper: E. Hegazi, H. Sjoland, and A. A. Abidi, "A filtering technique to lower LC oscillator phase noise," IEEE J. Solid-State Circuits, vol. 36, No. 12,pp. 1921-1930, Dec. 2001.

(Continued)

*Primary Examiner* — Joseph Chang
(74) *Attorney, Agent, or Firm* — WPAT, PC

(57) ABSTRACT

Inductor-capacitor oscillators and common mode resonators are provided. The inductor-capacitor oscillator includes a first transistor, a second transistor, an inductor, a first capacitor, a second capacitor, a first winding, and a second winding. The first transistor has a first terminal, a second terminal, and a third terminal. The second transistor has a fourth terminal, a fifth terminal and a sixth terminal. The first, second and third terminals are electrically connected to the fifth, fourth and sixth terminals, respectively. The first capacitor and the inductor are coupled between the first terminal and the fourth terminal. The second capacitor is coupled between the third terminal and a reference voltage. The first winding is coupled between the third terminal and the reference voltage. The second winding is coupled between the third terminal and the reference voltage. The first winding and the second winding are symmetric to each other.

13 Claims, 17 Drawing Sheets

(56) References Cited

U.S. PATENT DOCUMENTS

| | | | | |
|---|---|---|---|---|
| 2008/0266005 | A1* | 10/2008 | Jacobsson | H03B 5/124 |
| | | | | 331/108 A |
| 2008/0309435 | A1* | 12/2008 | Wu | H03B 5/1215 |
| | | | | 333/204 |
| 2010/0277207 | A1* | 11/2010 | Mahdavi | H03B 5/1228 |
| | | | | 327/118 |
| 2013/0135057 | A1* | 5/2013 | Roithmeier | H03B 5/124 |
| | | | | 331/117 FE |
| 2017/0179881 | A1* | 6/2017 | Caffee | H03B 5/08 |

OTHER PUBLICATIONS

IEEE paper: M. Garampazzi, P. M. Mendes, N. Codega, D. Manstretta, and R. Castello, "Analysis and design of a 195.6 dBc/Hz peak fom P-N class-B oscillator with transformer-based tail filtering," IEEE J. Solid-State Circuits, vol. 50, No. 7, pp. 1657-1668, Jul. 2015.

IEEE paper: R. Levinger, D. Ben-Haim, I. Gertman, S. Bershansky, R. Levi, J. Kadry and G. Horovitz ,"X-band NMOS and CMOS Cross-Coupled DCO's with a "Folded" Common-Mode Resonator Exhibiting 188.5 dBc/Hz FoM with 29.5% Tuning Range in 16-nm CMOS FinFet," IEEE Radio Freq. Integr. Circuits Symp. (RFIC), pp. 163-166. Jun. 2019.

OA letter of the counterpart TW application (appl. No. 108141541) mailed on Jan. 16, 2020. Summary of the OA letter(20200116 &20200506) (U.S. Pat. No. 8,305,182 B1).

OA letter of the counterpart TW application (appl. No. 108141541) mailed on May 6, 2020. Summary of the OA letter(20200116 &20200506) (U.S. Pat. No. 8,305,182 B1).

* cited by examiner

INDUCTOR-CAPACITOR OSCILLATOR AND COMMON MODE RESONATOR

BACKGROUND OF THE INVENTION

1. Field of the Invention

The present invention generally relates to an inductor-capacitor oscillator (LC oscillator) and a common mode resonator that can be applied to the LC oscillator.

2. Description of Related Art

FIG. 1 is a circuit diagram of a conventional LC oscillator. The transistor M1 and transistor M2 together form a cross-coupled pair and are utilized to provide the negative impedance that the LC oscillator needs. The inductor L1 and capacitor C1 are the primary inductor and capacitor which resonate at the operating frequency $$fo = \frac{1}{2\pi\sqrt{L1 \cdot C1}}.$$

One terminal of the inductor L1 is coupled to the drain of the transistor M1, and the other terminal of the inductor L1 is coupled to the drain of the transistor M2. The center tap of the inductor L1 is electrically connected to the power supply voltage VDD. Since the output signal VOP and the output signal VON together form a differential signal, the LC oscillator shown in FIG. 1 is a differential oscillator. The inductor L2 and capacitor C2 are the secondary inductor and capacitor which resonate at the frequency $$2 \times fo = \frac{1}{2\pi\sqrt{L2 \cdot C2}}.$$

The inductor L2 and capacitor C2 are aimed to reduce the phase noise of the LC oscillator. Since one terminal of the inductor L2 and one terminal of the capacitor C2 are coupled to the common mode node of the LC oscillator (i.e., the source of the transistor M1 and the source of the transistor M2), the combination of the inductor L2 and the capacitor C2 is referred to as a common mode resonator. The other terminal of the inductor L2 and the other terminal of the capacitor C2 are coupled to the ground level VSS.

In cases where the inductor L2 is not a symmetric inductor, or the signals at both terminals of the inductor L2 are different (e.g., one terminal is connected to the common mode node, and the other terminal is grounded), the electromagnetic field that the inductor L2 generates at one terminal of the inductor L1 differs from that at the other terminal of the inductor L1, leading to the asymmetric waveforms of the output signal VOP and the output signal VON (as shown in FIG. 2). Unfortunately, the asymmetric differential signal has a negative impact on the overall circuit.

SUMMARY OF THE INVENTION

In view of the issues of the prior art, an object of the present invention is to provide an LC oscillator and a common mode resonator, so as to make an improvement to the prior art.

An inductor-capacitor oscillator (LC oscillator) is provided. The LC oscillator includes a first transistor, a second transistor, a first capacitor, a second capacitor, an inductor, a first winding and a second winding. The first transistor has a first terminal, a second terminal and a third terminal. The second transistor has a fourth terminal, a fifth terminal and a sixth terminal. The first terminal is electrically connected to the fifth terminal, the second terminal is electrically connected to the fourth terminal, and the third terminal is electrically connected to the sixth terminal. The first capacitor is coupled between the first terminal and the fourth terminal. The inductor is coupled between the first terminal and the fourth terminal. The second capacitor is coupled between the third terminal and a reference voltage. The first winding is coupled between the third terminal and the reference voltage. The second winding is coupled between the third terminal and the reference voltage. The first winding and the second winding are symmetric to each other.

A common mode resonator is provided. The common mode resonator is applied to an LC oscillator and includes a capacitor, a first winding and a second winding. The capacitor is coupled between a reference voltage and a common mode node of the LC oscillator. The first winding is coupled between the reference voltage and the common mode node of the LC oscillator. The second winding is coupled between the reference voltage and the common mode node of the LC oscillator. The first winding and the second winding are symmetric to each other.

According to the present invention, the inductor used in the LC oscillator and the common mode resonator is highly symmetric, which helps reduce the phase noise without causing negative effects on the output of the LC oscillator. Compared to the conventional technology, the LC oscillator of the present invention and any LC oscillator that contains the common mode resonator of the present invention are low in phase noise and output a more symmetric output signal.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes inductor-capacitor oscillators (LC oscillators) and common mode resonators. On account of that some or all elements of the LC oscillators and the common mode resonators could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

In this document, the term "coupled" and the term "connected" may mean "directly coupled" and "directly connected" respectively, or "indirectly coupled" and "indirectly connected" respectively. "Coupled" and "connected" may also be used to indicate that two or more elements cooperate or interact with each other.

Although the terms "first," "second," etc., may be used herein to describe various elements, these elements should not be limited by these terms. Rather, these terms are only used to distinguish one element from another. For example, a first element could be termed a second element, and, similarly, a second element could be termed a first element, without departing from the scope of the embodiments.

Figure 1:
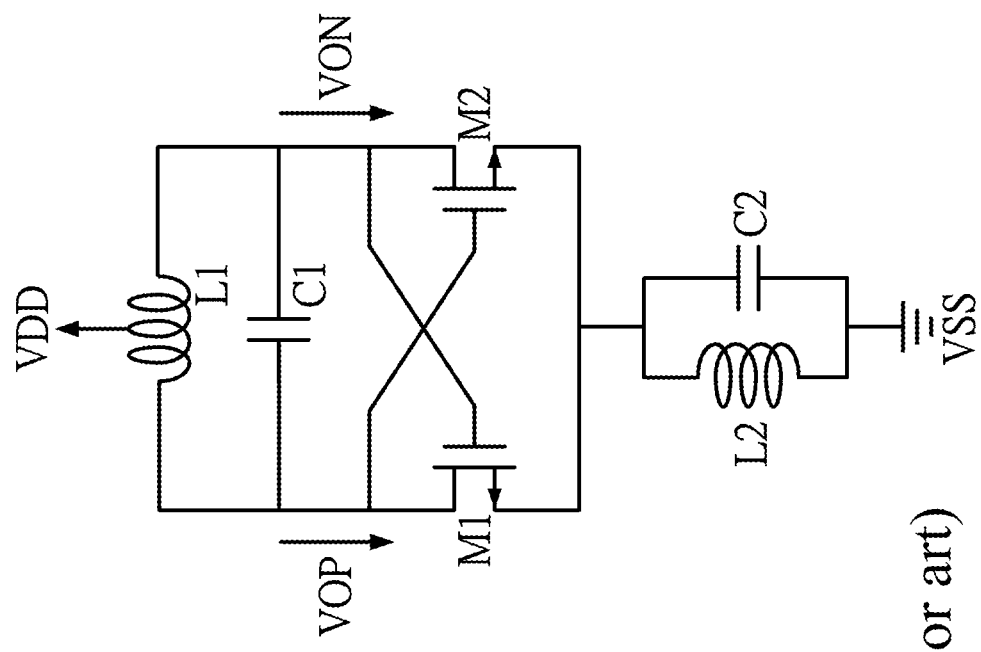
FIG. 1 illustrates a circuit diagram of a conventional LC oscillator.
Figure 2:
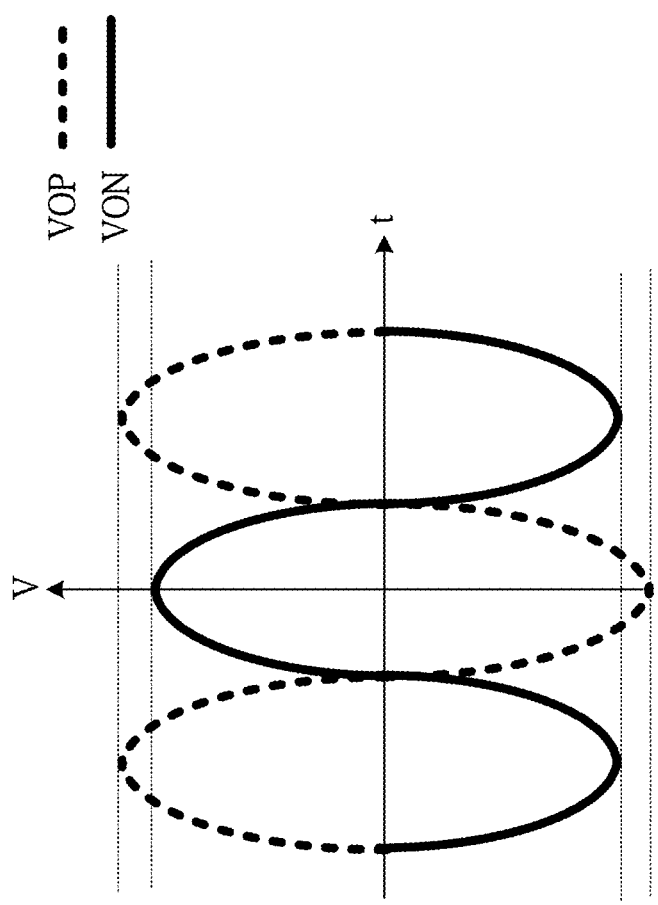
FIG. 2 illustrates waveforms of the output signals of the LC oscillator in FIG. 1.
Figure 3A:
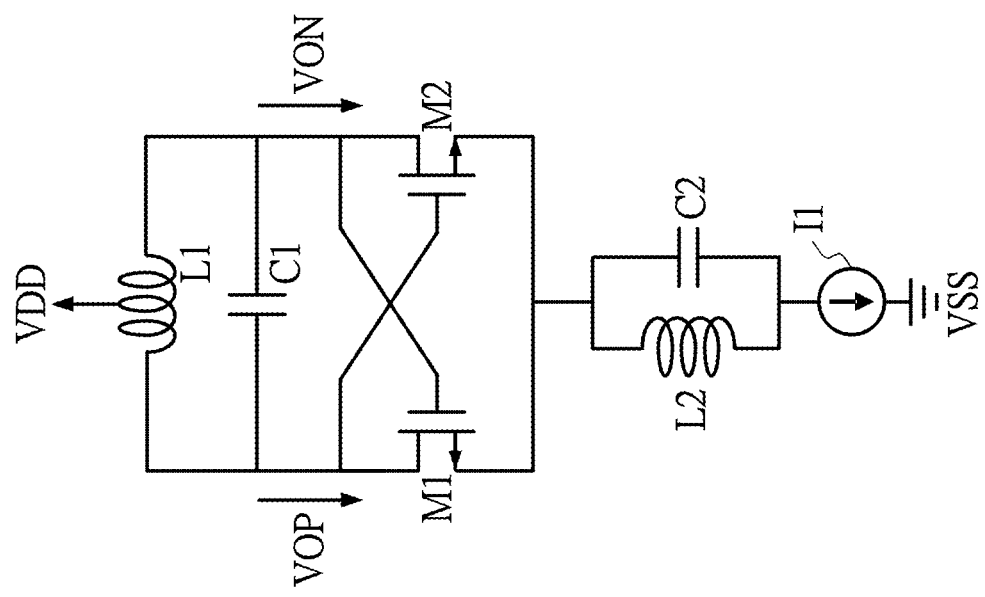
FIG. 3A illustrates an NMOS (short for N-type Metal-Oxide-Semiconductor Field-Effect Transistor (MOSFET))-based LC oscillator according to an embodiment of the present invention.
Figure 3B:
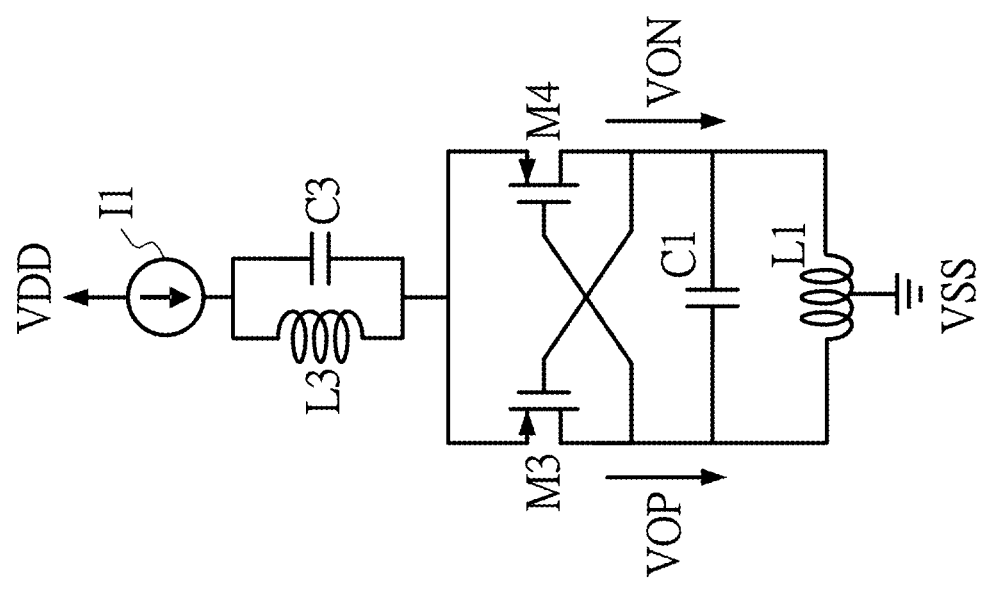
FIG. 3B illustrates a PMOS (short for P-type MOSFET)-based LC oscillator according to an embodiment of the present invention.
Figure 3C:
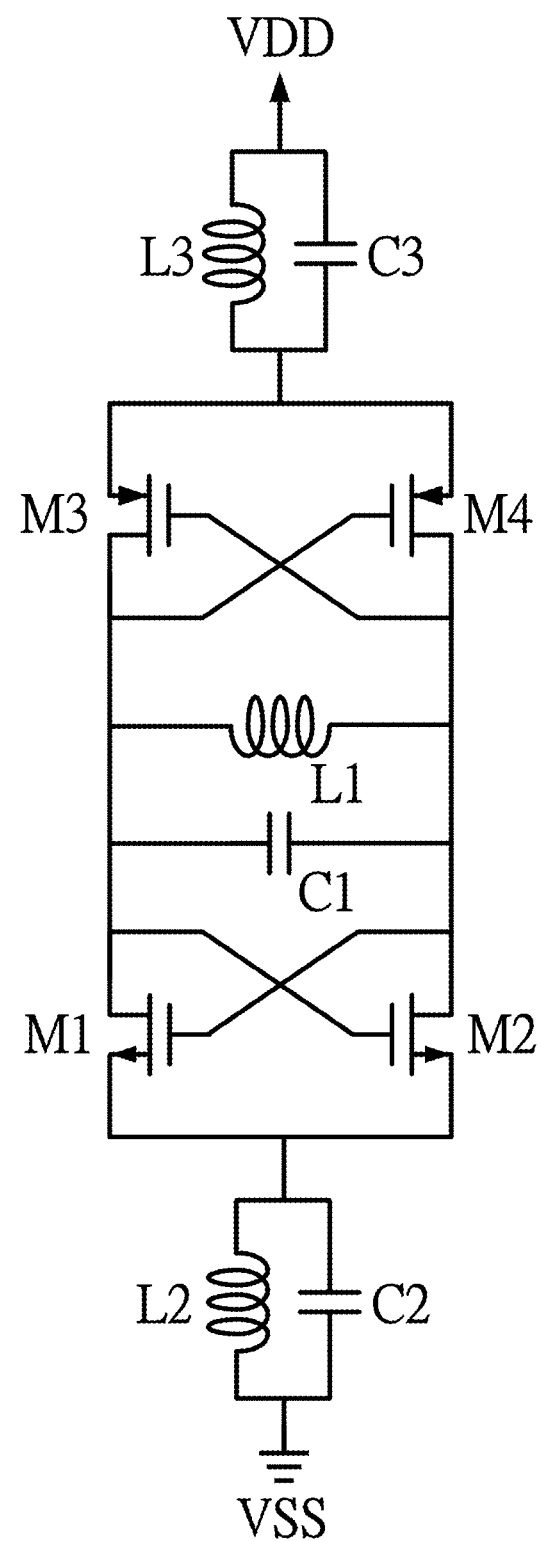
FIG. 3C illustrates a CMOS (Complementary Metal-Oxide-Semiconductor)-based LC oscillator according to an embodiment of the present invention.

FIG. 3A is an NMOS-based LC oscillator according to an embodiment of the present invention, and FIG. 3B is a PMOS-based LC oscillator according to an embodiment of the present invention. One terminal of the inductor L2 (or the inductor L3) of the common mode resonator is electrically connected to the sources of the transistor M1 and the transistor M2 (or to the sources of the transistor M3 and the transistor M4), and the other terminal of the inductor L2 (or the inductor L3) is electrically connected to the reference voltage or coupled to the reference voltage through the current source I1. In other words, the current source I1 can be omitted. Compared to being electrically connected to the reference voltage, the presence of the current source I1 provides a better control over the current of the LC oscillator. For the circuit in FIG. 3A, the reference voltage is the ground level VSS, whereas for the circuit in FIG. 3B, the reference voltage is the power supply voltage VDD. FIG. 3C is a CMOS-based LC oscillator according to an embodiment of the present invention. FIG. 3C is a combination of the circuit in FIG. 3A and the circuit in FIG. 3B. The inductor L2 and the capacitor C2 form a common mode resonator on the NMOS side, and the inductor L3 and the capacitor C3 form a common mode resonator on the PMOS side.

Figure 4A:
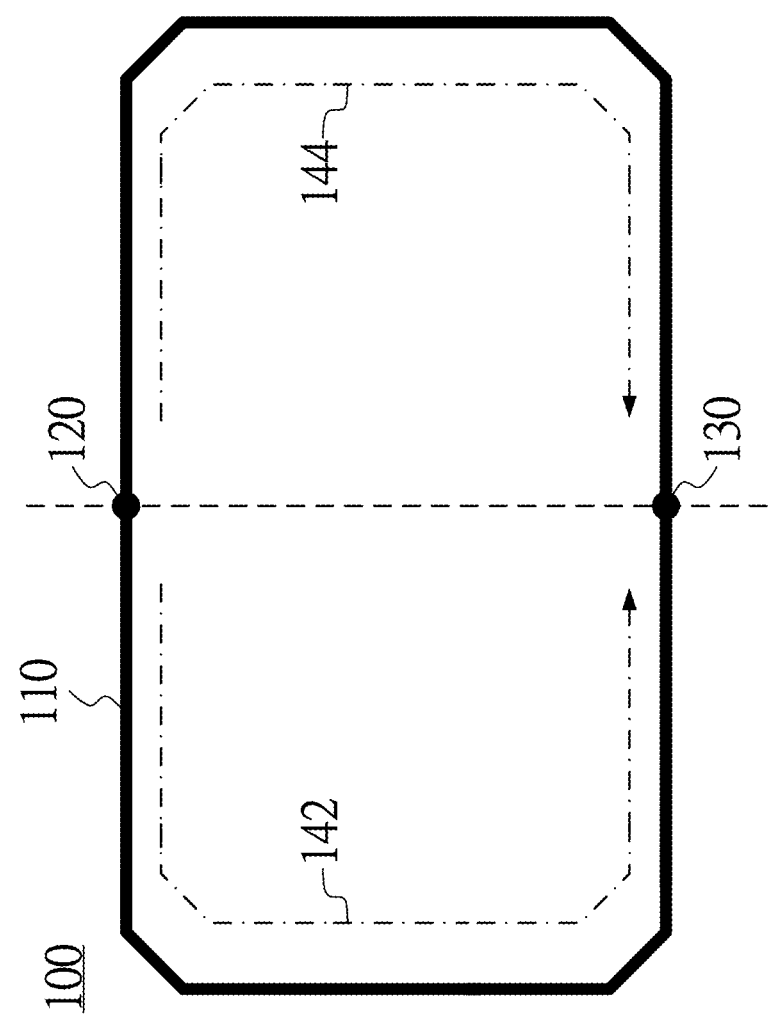
FIG. 4A illustrates an inductor structure applied to a common mode resonator of an LC oscillator according to an embodiment of the present invention.

FIG. 4A shows an inductor structure applied to a common mode resonator of an LC oscillator according to an embodiment of the present invention. The inductor 100, which can be used as the inductor L2 or the inductor L3 in FIGS. 3A to 3C, includes the closed wire 110, the node 120 and the node 130. The node 120 is electrically connected to the common mode node of the LC oscillator, and the node 130 is electrically connected to the reference voltage (i.e., the ground level VSS or the power supply voltage VDD) or coupled to the reference voltage through the current source I1. The closed wire 110 may include one or more traces of equal potential and may be implemented on one or more metal layers of the semiconductor structure. The traces fabricated on different metal layers are connected by through structures (such as vias or via arrays) so that the connected traces are substantially equipotential. The start point and end point of the closed wire 110 are connected, forming a closed pattern. The node 120 and the node 130 divide the closed wire 110 into two windings: the first winding and the second winding. The first winding starts from the node 120 and traces along the counterclockwise current path 142 to the node 130, and the second winding starts from the node 120 and traces along the clockwise current path 144 to the node 130.

Figure 4B:
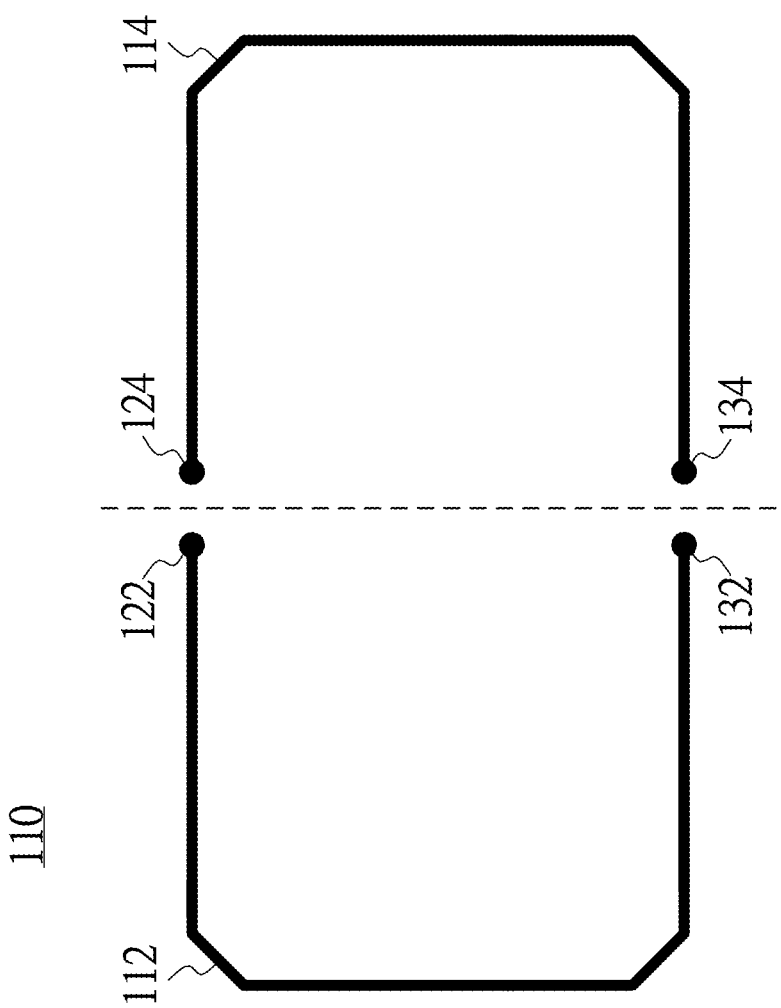
FIG. 4B illustrates the two windings of the closed wire 110 in FIG. 4A.

FIG. 4B shows the two windings of the closed wire 110 in FIG. 4A. The winding 112 has two end points—the end point 122 and the end point 132, and the winding 114 has two end points—the end point 124 and the end point 134. When the winding 112 and the winding 114 form the closed wire 110, the end point 122 and the end point 124 becomes the same node (i.e., the node 120) on the closed wire 110, and the end point 132 and the end point 134 become the same node (i.e., the node 130) on the closed wire 110. In other words, the end point 122 and the end point 124 are electrically connected to the common mode node of the LC oscillator, and the end point 132 and the end point 134 are electrically connected to the reference voltage or coupled to the reference voltage through the current source. The length of the winding 112 is substantially the same as the length of the winding 114, and the winding 112 and the winding 114 are symmetric to each other with respect to the line passing the node 120 and the node 130.

When the layout of the inductor 100 is applied to the inductor L2, the electric field generated by the inductor L2 is identical for both terminals of the inductor L1, and the magnetic fields generated by the inductor L2 can cancel each other and thus do not cause asymmetry in the waveforms of the output signal VOP and the output signal VON of the LC oscillator because the winding 112 and the winding 114 are symmetric to each other, the signal at the end point 122 is the same as the signal at the end point 124, and the signal at the end point 132 is the same as the signal at the end point 134. In addition, the inductor 100, as shown in FIGS. 4A and 4B, can be implemented by a single closed wire 110 (FIG. 4A) or by two windings (FIG. 4B).

Figure 5:
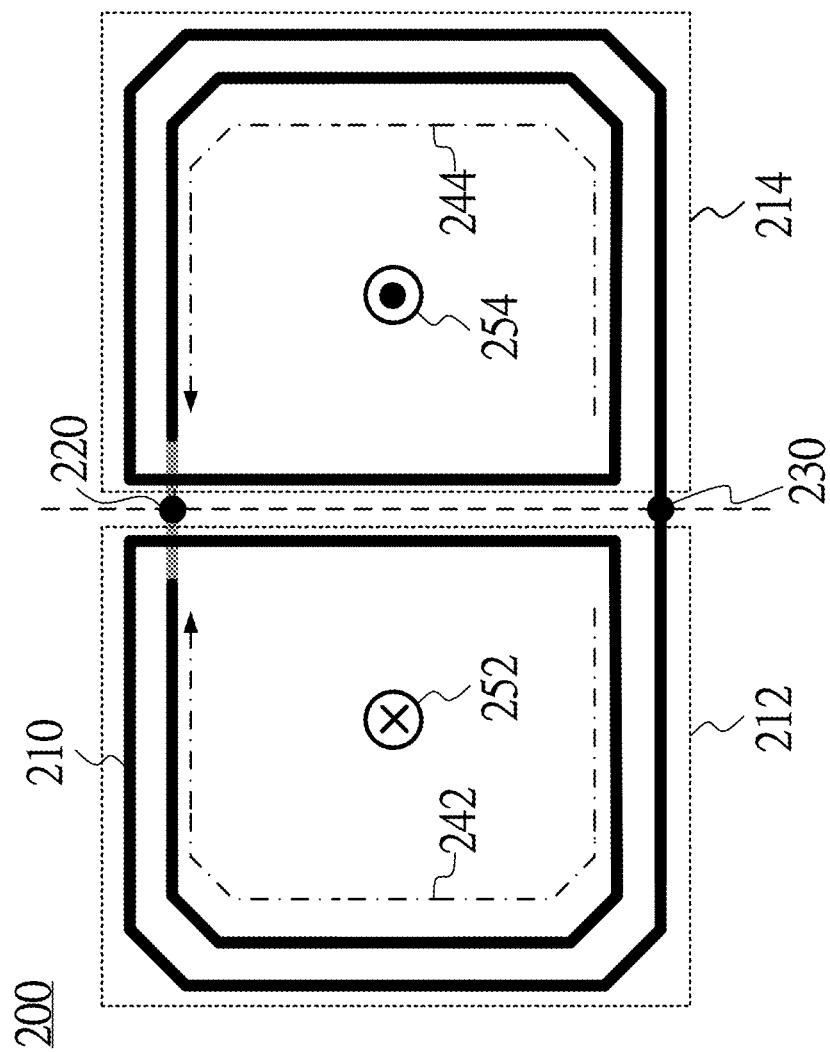
FIG. 5 illustrates an inductor structure applied to a common mode resonator of an LC oscillator according to an embodiment of the present invention.

FIG. 5 shows an inductor structure applied to a common mode resonator of an LC oscillator according to an embodiment of the present invention. The inductor 200, which can be used as the inductor L2 or the inductor L3 in FIGS. 3A to 3C, includes a closed wire 210, a node 220 and a node 230. One of the node 220 and the node 230 is electrically connected to the common mode node of the LC oscillator, while the other is electrically connected to the reference voltage or coupled to the reference voltage through the current source I1. The closed wire 210 may include one or more traces of equal potential and may be implemented on one or more metal layers of the semiconductor structure. For example, the black trace in FIG. 5 is located on the first metal layer, and the gray trace near the node 220 is located on the second metal layer different from the first metal layer. The black trace and the gray trace are connected via a through structure (not shown); therefore, the black trace and the gray trace are substantially equipotential. The start point and end point of the closed wire 210 are connected, forming a closed pattern. The node 220 and the node 230 divide the closed wire 210 into two windings: the first winding 212 and the second winding 214. The first winding 212 starts at the node 230 and traces along the clockwise current path 242 to the node 220, and the second winding 214 starts at the node 230 and traces along the counterclockwise current path 244 to the node 220. The length of the first winding 212 is substantially the same as the length of the second winding 214, and the first winding 212 and the second winding 214 are symmetric to each other with respect to the line passing the node 220 and the node 230. Because the current flowing through the first winding 212 and the current flowing through the second winding 214 are opposite in direction, the magnetic field 252 induced by the first winding 212 and the magnetic field 254 induced by the second winding 214 are opposite in direction. Consequently, magnetic field radiation can be avoided.

Figure 6A:
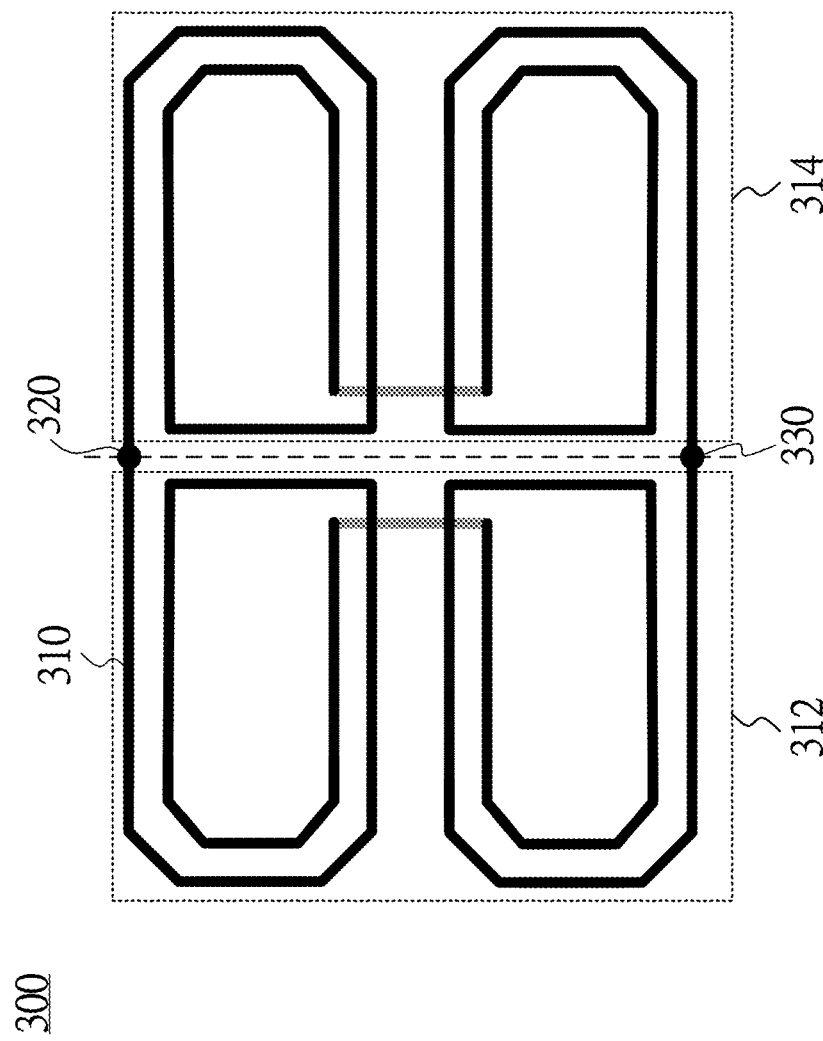
FIG. 6A illustrates an inductor structure applied to a common mode resonator of an LC oscillator according to an embodiment of the present invention.

FIG. 6A shows an inductor structure applied to a common mode resonator of an LC oscillator according to an embodiment of the present invention. The inductor 300, which can be used as the inductor L2 or the inductor L3 in FIGS. 3A to 3C, includes a closed wire 310, a node 320 and a node 330. One of the node 320 and the node 330 is electrically connected to the common mode node of the LC oscillator, while the other is electrically connected to the reference voltage or coupled to the reference voltage through the current source I1. The start point and end point of the closed wire 310 are connected, forming a closed pattern. The node 320 and the node 330 divide the closed wire 310 into two windings: the first winding 312 and the second winding 314. The length of the first winding 312 is substantially the same as the length of the second winding 314, and the first winding 312 and the second winding 314 are symmetric to each other with respect to the line passing the node 320 and the node 330.

Figure 6B:
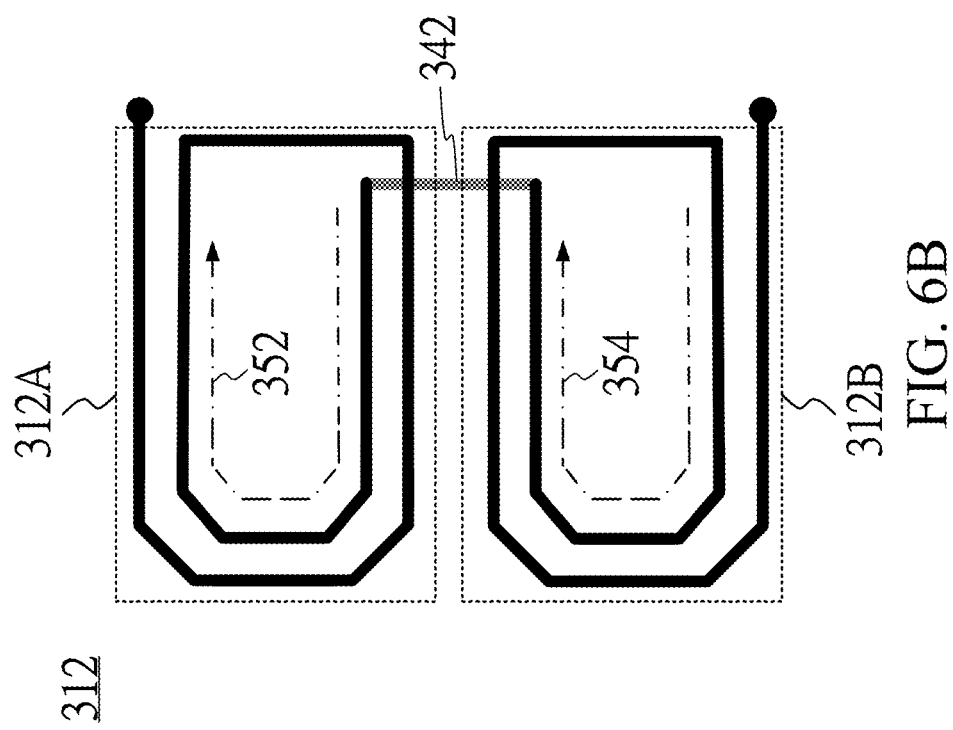
FIG. 6B illustrates one of the windings of the closed wire 310.

FIG. 6B shows one of the windings of the closed wire 310. The first winding 312 includes a first sub-winding 312A and a second sub-winding 312B. The first sub-winding 312A and the second sub-winding 312B are both spiral coils and are connected by the trace 342. The current flowing through the first sub-winding 312A (denoted by the current path 352) and the current flowing through the second sub-winding 312B (denoted by the current path 354) are the same in direction (i.e., both clockwise or counterclockwise, and being clockwise in the example layout of FIG. 6B). As a result, the magnetic field induced by the first sub-winding 312A and the magnetic field induced by the second sub-winding 312B are the same in direction.

Figure 7:
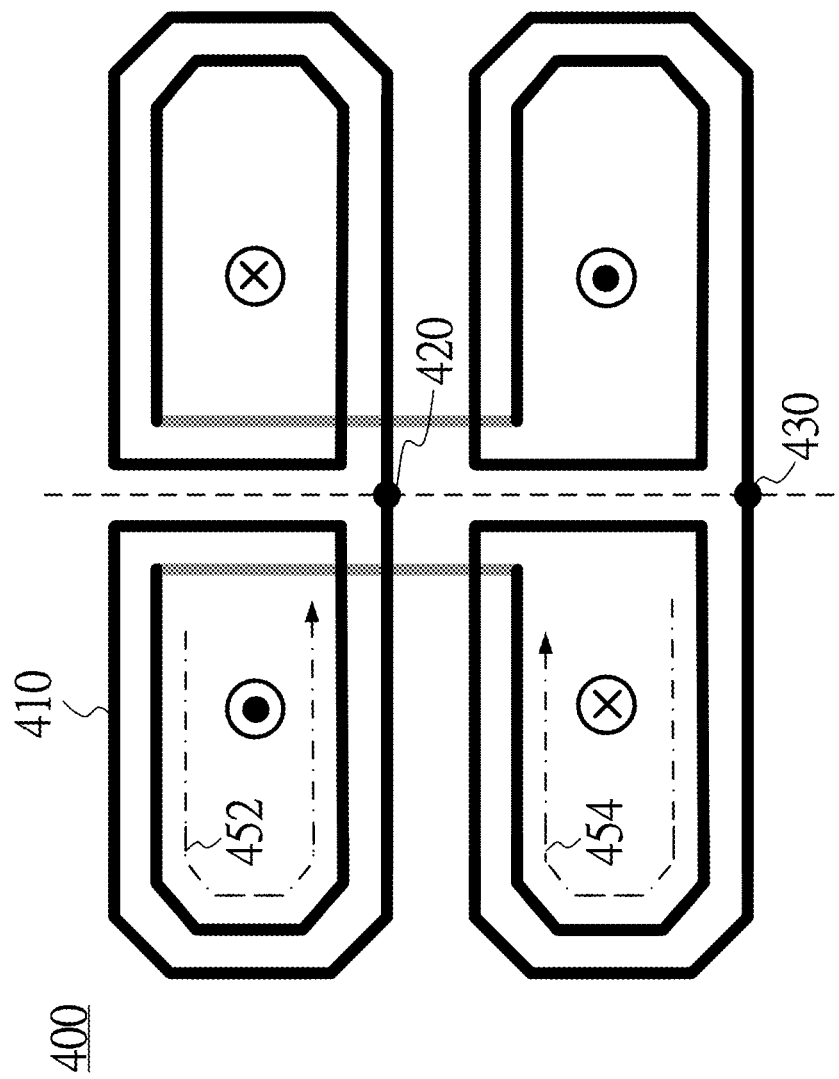
FIG. 7 illustrates an inductor structure applied to a common mode resonator of an LC oscillator according to an embodiment of the present invention.

FIG. 7 shows an inductor structure applied to a common mode resonator of an LC oscillator according to an embodiment of the present invention. The inductor 400, which can be used as the inductor L2 or the inductor L3 in FIGS. 3A to 3C, includes a closed wire 410, a node 420 and a node 430. One of the node 420 and the node 430 is electrically connected to the common mode node of the LC oscillator, while the other is electrically connected to the reference voltage or coupled to the reference voltage through the current source I1. The start point and end point of the closed wire 410 are connected, forming a closed pattern. Similar to the closed wire 310, the closed wire 410 is divided into two windings by the node 420 and the node 430. The two windings are substantially the same in length and symmetric to each other with respect to the line passing the node 420 and the node 430. Each of the two windings of the closed wire 410 includes two sub-windings, and each sub-winding is a spiral coil. Because the currents flowing through the two sub-windings are opposite in direction (e.g., one of the current path 452 and the current path 454 being clockwise while the other counterclockwise), the magnetic fields induced by the two sub-windings are opposite is direction.

Figure 8:
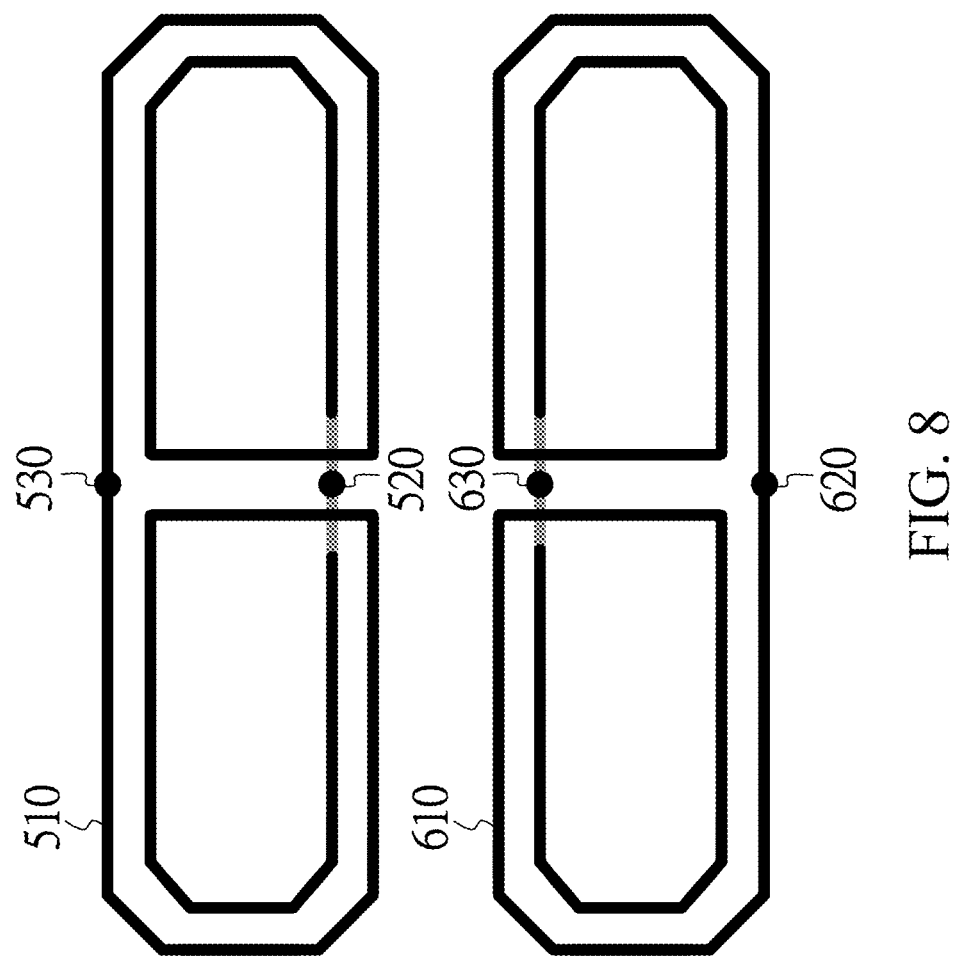
FIG. 8 illustrates the layouts of the inductor L2 and the inductor L3 in FIG. 3C according to an embodiment of the present invention.
Figure 9:
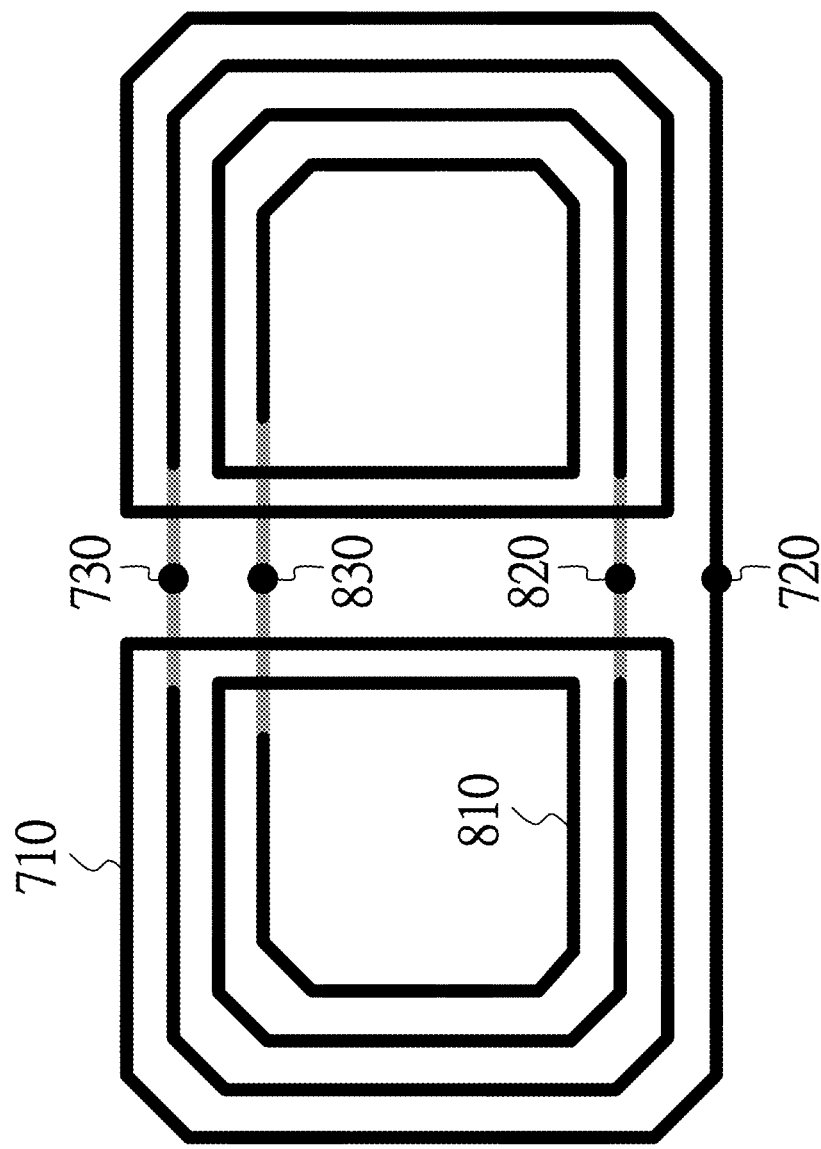
FIG. 9 illustrates the layouts of the inductor L2 and the inductor L3 in FIG. 3C according to another embodiment of the present invention.

For the CMOS-based LC oscillator in FIG. 3C, the layouts of the inductor L2 and the inductor L3 can be illustrated by the embodiment of FIG. 8 or FIG. 9.

FIG. 8 shows the layouts of the inductor L2 and the inductor L3 according to an embodiment of the present invention. The closed wire 510, the node 520 and the node 530 form a first inductor, and the closed wire 610, the node 620 and the node 630 form a second inductor. The first inductor and the second inductor are the same as the inductor 200; thus, the details are omitted for brevity.

FIG. 9 shows layouts of the inductor L2 and the inductor L3 according to another embodiment of the present invention. The closed wire 710, the node 720 and the node 730 form a first inductor, and the closed wire 810, the node 820 and the node 830 form a second inductor. The first inductor and the second inductor are the same as the inductor 200; thus, the details are omitted for brevity. As shown in FIG. 9, the area taken or surrounded by the first inductor overlaps the area taken or surrounded by the second inductor; as a result, the circuit area of the common mode resonator and the circuit area of the LC oscillator using that common mode resonator can be reduced.

In some embodiments, the first inductor in FIGS. 8 and 9 is the inductor L2 in FIG. 3C, and the second inductor in FIGS. 8 and 9 is the inductor L3 in FIG. 3C, in which case, one of the node 520 (or node 720) and the node 530 (or node 730) is electrically connected to the common mode node of the LC oscillator, while the other is coupled to the ground level VSS, and one of the node 620 (or node 820) and the node 630 (or node 830) is electrically connected to the common mode node of the LC oscillator, while the other is coupled to the power supply voltage VDD. In other embodiments, the first inductor in FIGS. 8 and 9 is the inductor L3 in FIG. 3C, and the second inductor in FIGS. 8 and 9 is the inductor L2 in FIG. 3C, in which case, one of the node 520 (or node 720) and the node 530 (or node 730) is electrically connected to the common mode node of the LC oscillator, while the other is coupled to the power supply voltage VDD, and one of the node 620 (or node 820) and the node 630 (or node 830) is electrically connected to the common mode node of the LC oscillator, while the other is coupled to the ground level VSS.

Figure 10A:
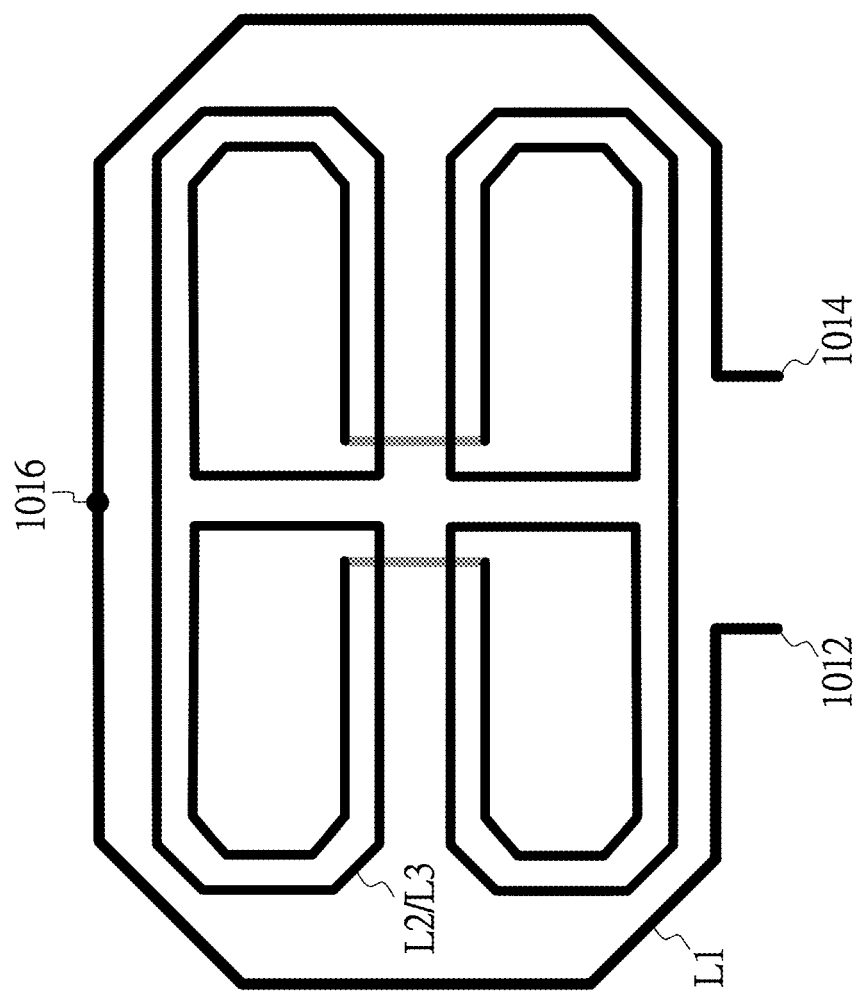
FIGS. 10A and 10B illustrate the layouts of the inductors of the NMOS-based or PMOS-based LC oscillator.
Figure 10B:
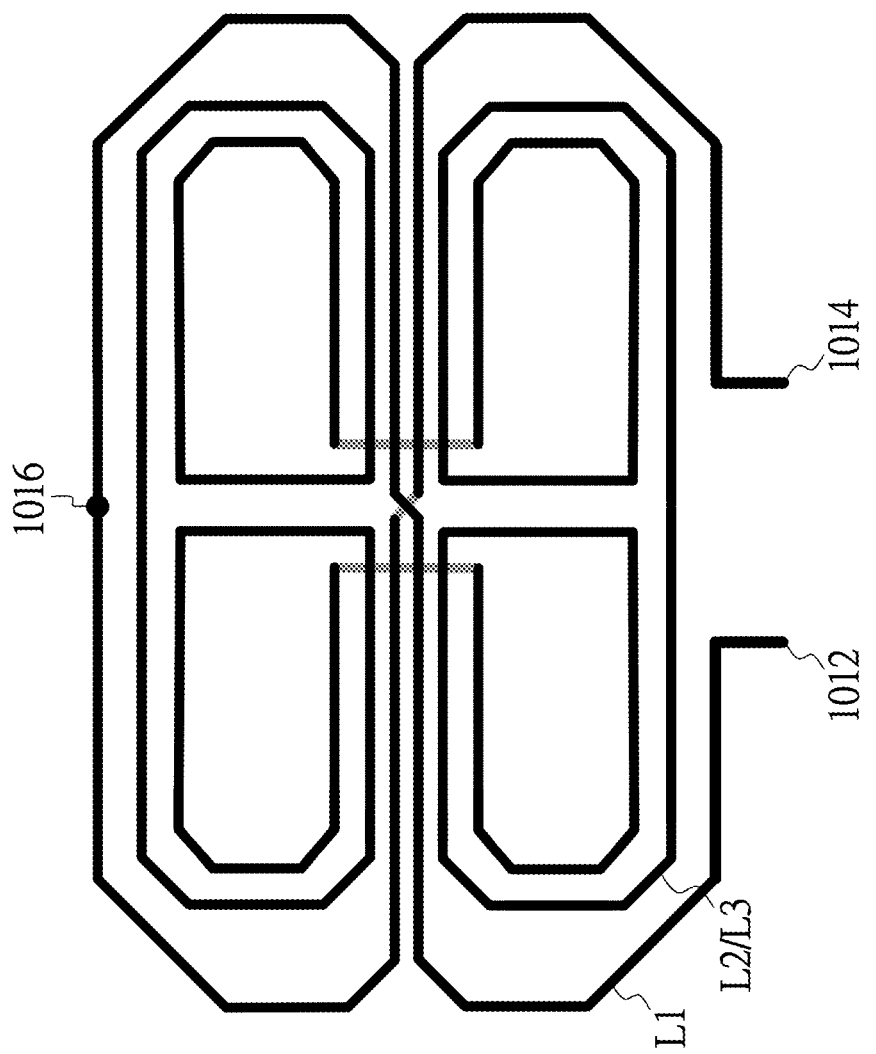

In some embodiments, the overall circuit area of the LC oscillator can be further reduced by overlapping the area(s) taken or surrounded by the inductor L2 and/or the inductor L3 with the area taken or surrounded by the inductor L1. FIGS. 10A and 10B show the layouts of the inductors of the NMOS-based or PMOS-based LC oscillator, and FIGS. 11A and 11B show the layouts of the inductors of the CMOS-based LC oscillator.

In FIG. 10A, the inductor L1 is a single-turn symmetric inductor. In FIG. 10B, the inductor L1 is an 8-shaped inductor. The inductor L1 includes an end point 1012, an end point 1014 and a node 1016. The end point 1012 is electrically connected to the drain of the transistor M1 or the drain of the transistor M3, the end point 1014 is electrically connected to the drain of the transistor M2 or the drain of the transistor M4, and the node 1016 can be used as a central tap of the inductor L1 and is coupled to the power supply voltage VDD or the ground level VSS. The structure of the inductor L2 or the inductor L3 is the same as that of the inductor 300 in FIG. 6A; thus, the details are omitted for brevity. In other embodiments, the inductor L2 and the inductor L3 can be implemented with the inductor 200 or the inductor 400.

Figure 11A:
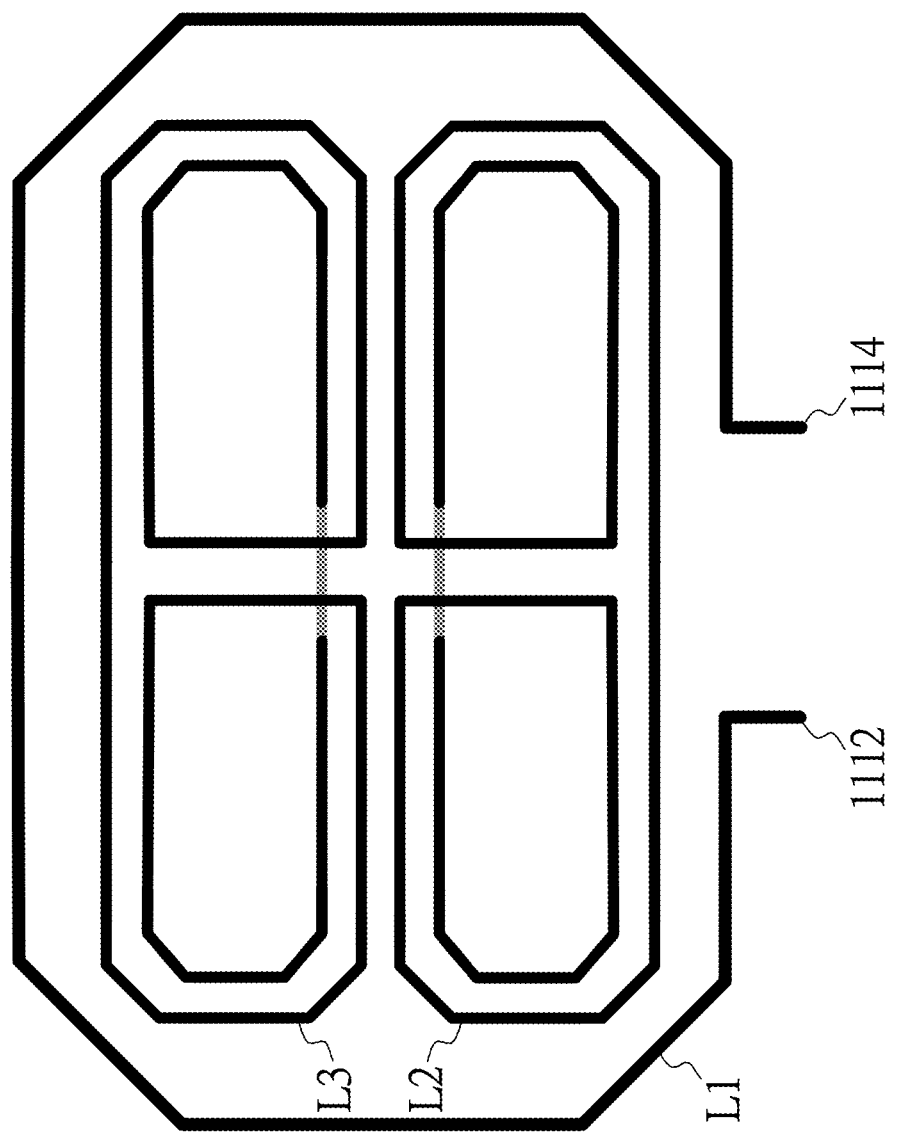
FIGS. 11A and 11B illustrate the layouts of the inductors of the CMOS-based LC oscillator.
Figure 11B:
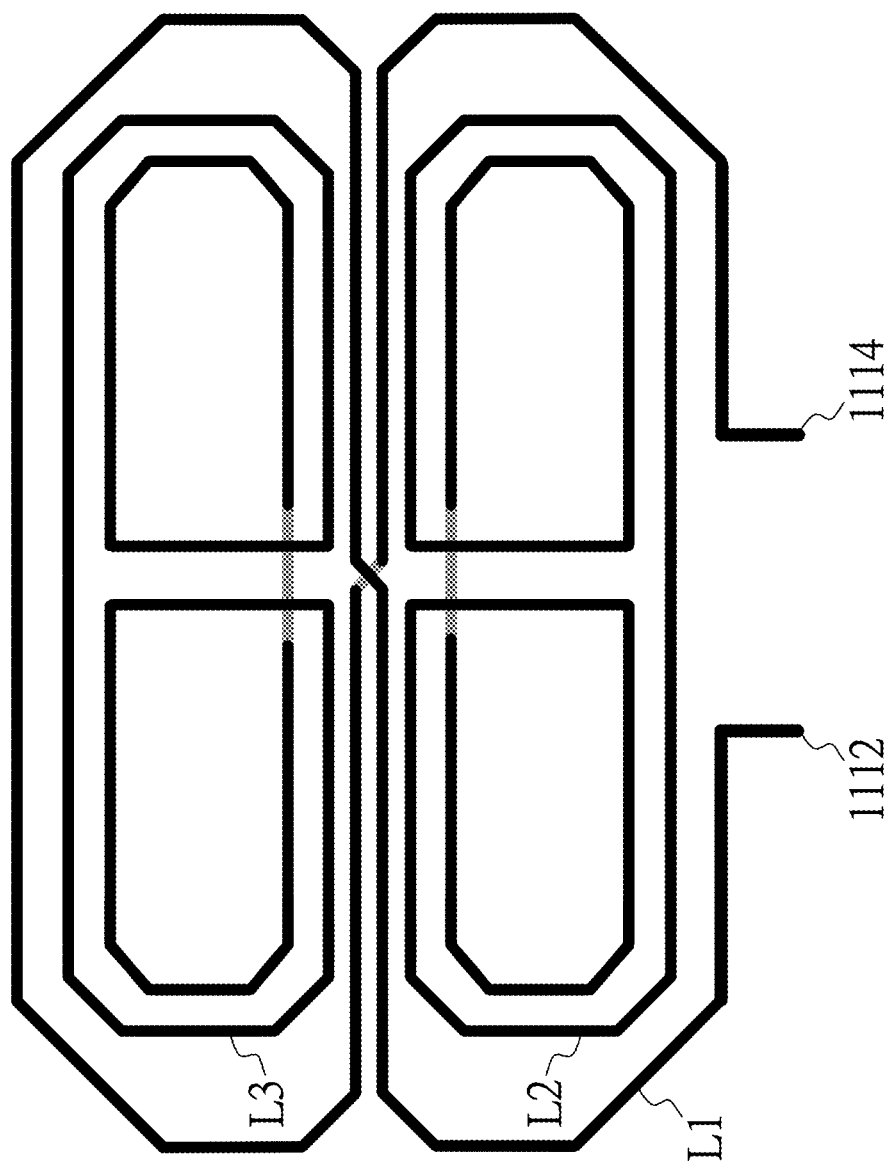

In FIG. 11A, the inductor L1 is a single-turn symmetric inductor. In FIG. 11B, the inductor L1 is an 8-shaped inductor. The inductor L1 includes an end point 1112 and an end point 1114. The end point 1112 is electrically connected to the drain of the transistor M1 or the drain of the transistor M3, and the end point 1114 is electrically connected to the drain of the transistor M2 or the drain of the transistor M4. Since the structures of the inductor L2 and the inductor L3 are the same as those of the first inductor and the second inductor in FIG. 8, the details are omitted for brevity. In other embodiments, the inductor L2 and the inductor L3 can be implemented with the first inductor and the second inductor in FIG. 9.

As shown in FIGS. 10A, 10B, 11A and 11B, because the inductor L2 and the inductor L3 of the present invention are highly symmetric to each other in structure, there is no huge interference with the LC oscillator even if the inductor L1 is overlapped with the inductor L2 and/or the inductor L3.

Although FIGS. 10A, 10B, 11A and 11B show that the area of the inductor L1 is larger than the area(s) of the inductor L2 and/or the inductor L3, the area(s) of the inductor L2 and/or the inductor L3 may be larger than the area of the inductor L1 in other embodiments.

In the above embodiment, the black traces can be implemented on a first conductor layer in the semiconductor structure, and the gray traces can be implemented on a second conductor layer. The first conductor layer may be one of the ultra-thick metal (UTM) layer and the re-distribution layer (RDL), and the second conductor layer is the other. The traces (not shown) connecting the nodes can be implemented on the UTM layer or the RDL, or on another metal layer closer to the substrate. The conductor layers in the semiconductor structure are well known to people having ordinary skill in the art; thus, the details are omitted for brevity.

The MOSFETs in the above embodiments can be replaced with bipolar junction transistors (BJTs), with the base of the BJT corresponding to the gate of the MOSFET, the emitter of the BJT corresponding to the drain of the MOSFET, and the collector of the BJT corresponding to the source of the MOSFET.

Please note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An inductor-capacitor oscillator (LC oscillator), comprising:
   a first transistor, having a first terminal, a second terminal and a third terminal;
   a second transistor, having a fourth terminal, a fifth terminal and a sixth terminal, wherein the first terminal is electrically connected to the fifth terminal, the second terminal is electrically connected to the fourth terminal, and the third terminal is electrically connected to the sixth terminal;
   a first capacitor, coupled between the first terminal and the fourth terminal;
   an inductor, coupled between the first terminal and the fourth terminal;
   a second capacitor, coupled between the third terminal and a reference voltage;
   a first winding, coupled between the third terminal and the reference voltage; and
   a second winding, coupled between the third terminal and the reference voltage;
   wherein the first winding and the second winding are symmetric to each other, the first winding and the second winding are two concurrently existing windings, and the first winding and the second winding form a closed wire.

2. The LC oscillator of claim 1, wherein the first winding and the second winding are substantially the same in length.

3. The LC oscillator of claim 1, wherein the closed wire is implemented on at least one conductor layer of a semiconductor structure.

4. The LC oscillator of claim 1, wherein the first winding and the second winding are spiral coils, a current direction in the first winding is clockwise, and a current direction in the second winding is counterclockwise.

5. The LC oscillator of claim 1, wherein the first winding comprises a first spiral coil and a second spiral coil, a current direction in the first spiral coil is clockwise, and a current direction in the second spiral coil is clockwise.

6. The LC oscillator of claim 1, wherein the first winding comprises a first spiral coil and a second spiral coil, a current direction in the first spiral coil is clockwise, and a current direction in the second spiral coil is counterclockwise.

7. The LC oscillator of claim 1, wherein the inductor overlaps the first winding and the second winding.

8. A common mode resonator, applied to an inductor-capacitor oscillator (LC oscillator), comprising:
   a capacitor, coupled between a reference voltage and a common mode node of the LC oscillator;
   a first winding, coupled between the reference voltage and the common mode node of the LC oscillator; and
   a second winding, coupled between the reference voltage and the common mode node of the LC oscillator;
   wherein the first winding and the second winding are symmetric to each other, the first winding and the second winding are two concurrently existing windings, and the first winding and the second winding form a closed wire.

9. The common mode resonator of claim 8, wherein the first winding and the second winding are substantially the same in length.

10. The common mode resonator of claim 8, wherein the closed wire is implemented on at least one conductor layer of a semiconductor structure.

11. The common mode resonator of claim 8, wherein the first winding and the second winding are spiral coils, a current direction in the first winding is clockwise, and a current direction in the second winding is counterclockwise.

12. The common mode resonator of claim 8, wherein the first winding comprises a first spiral coil and a second spiral coil, a current direction in the first spiral coil is clockwise, and a current direction in the second spiral coil is clockwise.

13. The common mode resonator of claim 8, wherein the first winding comprises a first spiral coil and a second spiral coil, a current direction in the first spiral coil is clockwise, and a current direction in the second spiral coil is counterclockwise.

* * * * *